US 6,573,568 B2

(12) United States Patent
Lin et al.

(10) Patent No.: US 6,573,568 B2
(45) Date of Patent: Jun. 3, 2003

(54) ESD PROTECTION DEVICES AND METHODS FOR REDUCING TRIGGER VOLTAGE

(75) Inventors: Shi-Tron Lin, Taipei (TW); Wei-Fan Chen, Taichung (TW); Chenhsin Lien, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/871,999

(22) Filed: Jun. 1, 2001

(65) Prior Publication Data

US 2002/0190333 A1 Dec. 19, 2002

(51) Int. Cl.[7] .................. H01L 29/76; H01L 29/94; H01L 31/062; H01L 31/113; H01L 31/119
(52) U.S. Cl. ........................ 257/365; 438/284
(58) Field of Search ................ 257/402, 355, 257/356, 371, 357, 358, 359, 360, 361, 362, 363, 364, 365

(56) References Cited

U.S. PATENT DOCUMENTS 6,143,594 A * 11/2000 Tsao et al. ............... 438/199
6,281,554 B1 * 8/2001 Pan .......................... 257/357
6,329,694 B1 * 12/2001 Lee et al. ................. 257/372

FOREIGN PATENT DOCUMENTS

JP 406236999 A * 8/1994

* cited by examiner

Primary Examiner—Wael Fahmy
Assistant Examiner—Dana Farahani
(74) Attorney, Agent, or Firm—Ladas & Parry

(57) ABSTRACT

ESD protection devices and methods to form them are provided in this invention. By employing the thin gate oxide fabricated by a dual gate oxide process, ESD protection devices with a lower trigger voltage are provided. The NMOS for ESD protection according to the present invention has islands with thin gate oxides and a control gate with a thick gate oxide. These islands overlap the drain region of the NMOS to reduce the breakdown voltage of the PN junction in the drain region, thereby reducing the ESD trigger voltage and improving the ESD protection level of the NMOS. Furthermore, the invention is applicable to general integrated-circuit processes as well as various ESD protection devices.

36 Claims, 11 Drawing Sheets

ESD PROTECTION DEVICES AND METHODS FOR REDUCING TRIGGER VOLTAGE

BACKGROUND OF THE INVENTION

1. Field of the Invention

The present invention relates to electrostatic discharge (ESD) protection devices and relevant methods to form those devices. In particular, the present invention relates to ESD protection devices and methods suitable for a dual gate process.

2. Description of the Related Art

As products based on integrated circuitry (ICs) become more delicate, they also become more vulnerable to the impacts of external environment, especially to ESD stress occurring when one pin of an IC is grounded and anther pin of the IC contacts an electrostatically-precharged object. Therefore, input pins, output pins, and input/output pins, the power-bus pins for an IC for communicating with external systems, must all be well equipped with ESD protection devices or circuitry to meet the minimum level of ESD robustness required by commercial applications.

NMOS (Negative-type Metal On Semiconductor Field Effect Transistor), either with the gate grounded or with the gate coupled to a positive voltage during an ESD event, have commonly been used as primary ESD protection devices for ICs. It is well known that the drain contact of an NMOS must be kept a few microns apart from the gate of the NMOS. What is implied is that the drain side of an NMOS confronting ESD stress in the front line must have a distributed resistor connected in series between the channel under the gate and a drain contacts coupled to an IC pad, and the resistance of the distributed resistor must be larger than an acceptable value. If the ESD transient current starts to localize at a weak spot near the gate, it causes the entire ESD current to rush in, thereby causing local heating and eventually damaging the NMOS. On the other hand, the distributed resistor helps to raise the potential of the adjacent diffusion area, and hence induce a more uniform ESD current flow towards the whole channel.

The advanced salicide process, which forms silicide material on drain/source regions to reduce the resistance of active regions and speeds up the circuit operation rate, however, makes construction of the above-mentioned resistor more difficult and costly.

One known solution for the problems induced by the salicide process is to use the salicide block process, which blocks the formation of silicide on certain diffusion regions. However, this solution is inefficient due to the process complexity and the extra mask required.

U.S. Pat. No. 5,721,439 (hereafter referred as '439 patent) discloses an MOS structure comprising a number of isolated islands in the drain diffusion region (as shown in FIG. 1). The ESD transient current flows around these isolated islands from the drain contacts 10, toward the drain-gate edge, thereby increasing drain resistance to improve ESD protection.

U.S. Pat. No. 5,248,892 discloses an MOS structure comprising a resistor means whose width is substantially equal to the width of the active zone, wherein the resistor means comprises a number of strips of titanium silicide overlying a resistance zone (n-well) and extending substantially parallel to each to increase drain resistance.

U.S. Pat. No. 6,046,087 discloses an ESD protection device using a second gate as silicide-blocking mask for the drain region, wherein the second gate overlies an N-well region and separates the drain of the host transistor into two portions.

SUMMARY OF THE INVENTION

An object of the present invention is to combine two different kinds of structures for different operating voltages in the same active region.

Another object of the present invention is to reduce the ESD protection trigger voltage of an ESD protection device, thereby improving its ESD protection level.

The MOS structure for ESD protection, according to the present invention, is suitable to a dual gate process, which fabricates a thick gate oxide and a thin gate oxide on the same wafer. The MOS structure comprises at least one first island and a gate. The first island has a first conductive segment and a thin gate oxide. The first conductive segment is stacked on the thin gate oxide. The gate has a gate oxide thicker than the thin gate oxide.

The gate can be a control gate with the thick gate oxide, or a gate with field oxide.

The drain and the source of the MOS structure can be each coupled to a pad, respectively.

The advantage of the MOS structure according to the present invention is that its ESD protection trigger voltage is lower by the existence of the island. It implies that the MOS structure has a quicker trigger mechanism and a better ESD protection level when compared to the case without the island.

The present invention provides a method for early trigger of an ESD device. This method is applicable to a dual gate process as well as other IC processes. A first ESD device has a first ESD trigger voltage. A second ESD device is constructed based on the structure of the first ESD device. The second ESD device is essentially of the same construction as the first ESD device, but can have a different size, dimension, etc. An island having a thin gate oxide is incorporated with or proximate to the second ESD device, such that the second ESD device has a second trigger voltage lower than the first trigger voltage.

The fabrication method for an ESD protection device with lower trigger voltage according to the present invention is provided. An active region surrounded by an isolation region (e.g. a field oxide region) on a semiconductor wafer is formed. Within the active region, a thick gate oxide in a first region and a thin gate oxide in a second region are formed. A conductive layer on the first and second gate oxides is then formed. Then the conductive layer is patterned to form a first element on the first region and a second element on the second region.

The first element can be a gate of an MOS operated in a relative-high voltage. The second element can be an island overlapping the active region. In addition, another MOS device in another active region and operated in a relative-low voltage can be fabricated on the same wafer based on the thin gate oxide.

A diode structure with reduced ESD trigger voltage is provided in this invention. The diode comprises a first region, at least one island and a second region. The first region forms a first layer of a first conductivity type. The island is located on the first layer, having a conductive segment and a thin gate oxide. The first conductive segment is stacked on the thin gate oxide. The second region is located adjacent to the first region to form a second layer of a second conductivity type. A PN junction is formed between the first layer and the second layer. The second layer has a profile determined by the island and the second region. The island at least partially overlaps the second region for reducing ESD trigger voltage of the PN junction.

An exceeding-voltage-rating structure for enhancing ESD protection is provided, applied for a dual gate process which fabricates a first gate structure for operating in a relatively-low voltage and a second gate structure for operating in a relatively-high voltage. The exceeding-voltage rating structure comprises a first region, at least one island and a second region. The first region forms a first layer of a first conductivity type. The island has the first gate structure on the first layer. The second region is located adjacent to the first region to form a second layer of a second conductivity type and a PN junction between the first layer and the second layer. The second layer has a profile determined by the island and the second region. The island at least partially overlaps the second region to reduce ESD trigger voltage of the PN junction, and the exceeding-voltage-rating structure is operated in a relatively-high voltage application during a powered-on circuit operation.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

The present invention is especially suitable for a dual gate process. The dual gate process can fabricate an integrated circuit with two kinds of gate oxides. Thick gate oxides occur due to operating voltage difference in the IC. Thick gate oxides sustain a higher voltage stress without breakdown and have better reliability, while thin gate oxides sustain a lower voltage. For example, in a 0.25 um CMOS (complementary metal on semiconductor) technology, 40-angstrom gate oxide is used as the gate oxide for 2.5 v operated MOS, and 70-angstrom gate oxide is used as the gate oxide for 3.3 v operated MOS.

First Embodiment

Figure 1:
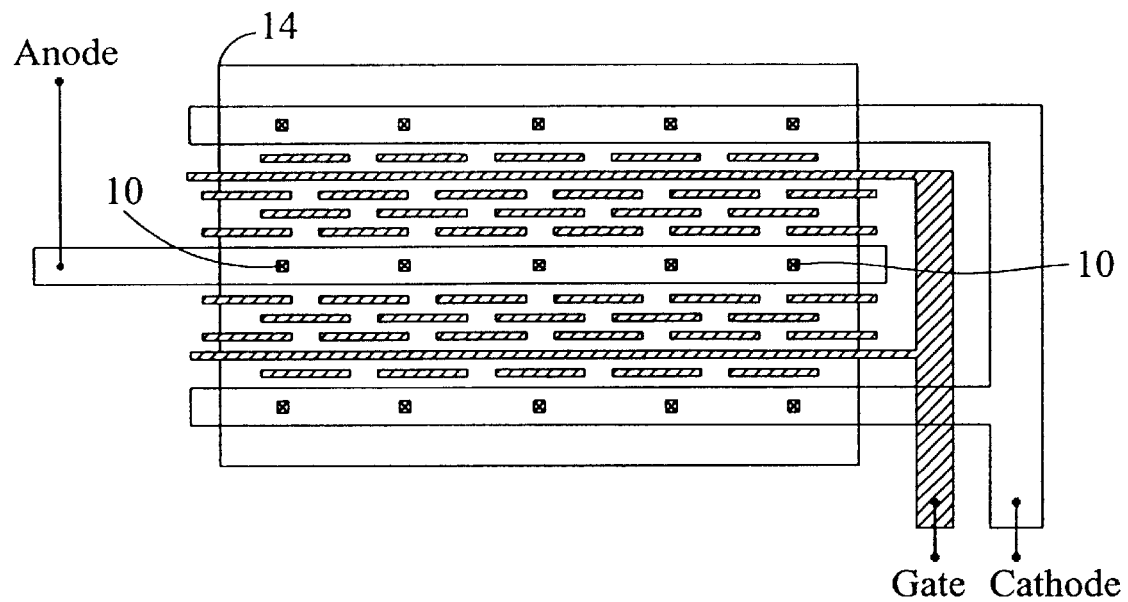
FIG. 1 is a conventional NMOS with isolated islands in drain diffusion region.
Figure 2:
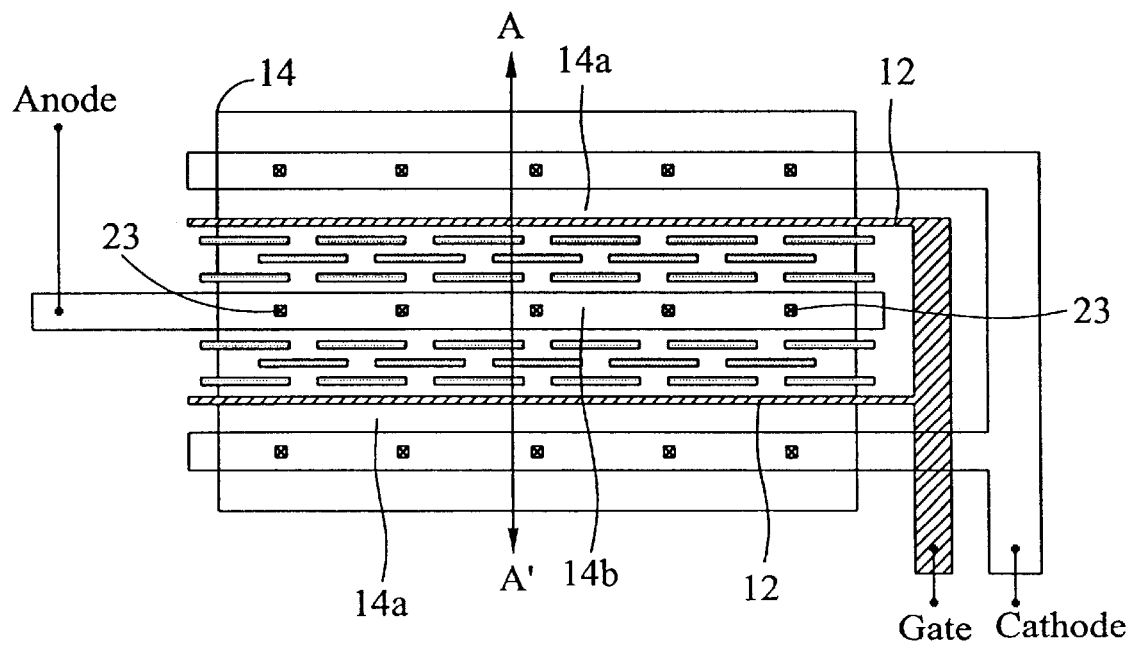
FIG. 2 shows a layout view of an NMOS structure according to the present invention.
Figure 3:
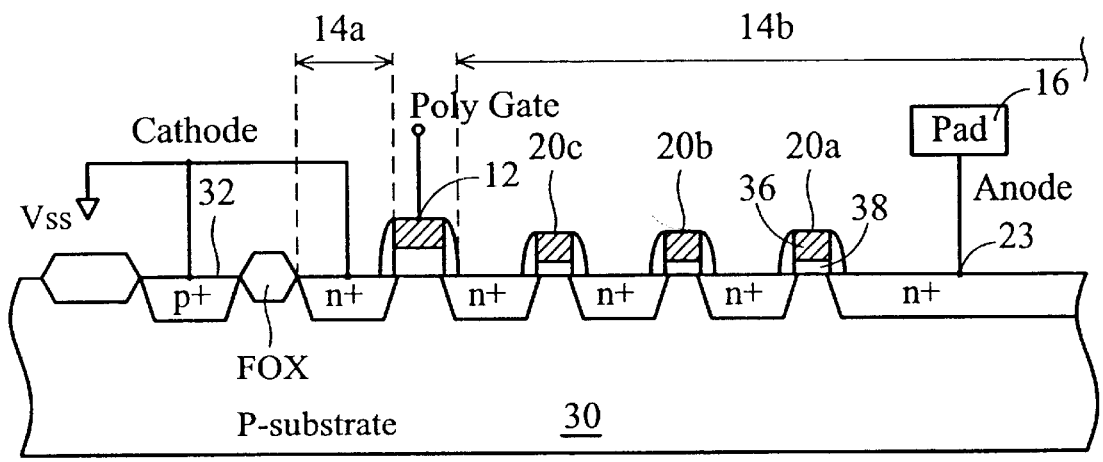
FIG. 3 is a cross-section of the NMOS structure in FIG. 2 along a portion of line A–A'.

FIG. 2 shows a layout view of an NMOS structure according to the present invention. FIG. 3 is a cross-section of the NMOS structure in FIG. 2 along a portion of line A–A'.

The ESD protection device in FIG. 2 is a multi-finger-type NMOS with two poly gates 12 coupled together. The gate oxides of these two poly gates 12 are thick oxide gates.

An active region 14 is surrounded by a field oxide (FOX) isolation region, which-is typically formed by local oxidation (LOCOS) or shallow trench isolation (STI). The active region 14 is typically ion-implanted by negative-type ions and then annealed by thermal cycles to form heavily n-doped (n+) layers. The ion implant is blocked by any poly gate, poly segment or field oxide region present within the active region. Within the active region 14, two channel regions under the poly gates 12 are formed. The portion of the active region 14 between the two poly gates 12 is referred to as a drain diffusion region 14b, serving as an anode and coupled to a pad 16, and the portions of the active region 14 sandwiching the two poly gates in between are referred to as source diffusion regions 14a, serving as a cathode and coupled to a Vss power rail. The drain and source diffusion regions (14b and 14a) are separated by the poly gates 12 as well as the channel underneath the poly gates 12. Islands 20, each consisting of a poly segment 36 with a thin gate oxide 38 thereunder, are distributed in the drain diffusion region 14b. Some of these islands 20 partially overlap the drain diffusion region 14b, having a portion on the field oxide region and another portion on the drain diffusion region 14b. Some of these islands 20 are located within (or enclosed by) the drain diffusion region 14b.

In FIG. 3, from right to left, are a drain contact 23 in the drain diffusion region 14b, three rows of islands 20 with thin gate oxides, a poly gate 12 with a thick gate oxide, a source diffusion region 14a, and finally, a p+ guard-ring region 32 (not shown in FIG. 2) in the p-well/p-substrate 30. Drain diffusion region 14b can be coupled to a pad; source diffusion region 14a and the p-well/p-substrate 30 can be coupled to the Vss power rail. A distinctive feature is that, at least one of the islands has a thin gate oxide, but the poly gate 12 has a thick gate oxide.

Experiments with a 240 um-channel-width and 0.6 um-channel-length multi-finger NMOS resulted in ESD performance as shown in Table 1.

TABLE 1

| | Gate oxide thickness | | Discharge Trigger | HBM (human body mode) ESD |
|---|---|---|---|---|
| | for the poly gate | for islands | voltage in the drain region | protection performance |
| Conventional | 70A | (no island) | 9 V | 1.5 KV |
| Conventional | 70A | 70A | 9 V | 2.5 KV |
| This invention | 70A | 40A | 7.5 V | >8 KV |

The NMOS of the invention, as shown in table 1, has a much better ESD protection performance than the conventional NMOS.

The tremendous improvement for the NMOS of this invention is at least due to a lower trigger voltage. The two conventional NMOS configurations in table 1, differing in the presence of islands, have different levels of ESD protection performance, since that having 70A-gate-oxide islands can disperse ESD current more evenly. However, the NMOS of the present invention has the best ESD protection performance, since the 40A-gate-oxide islands have a lower trigger voltage (7.5 V) for early trigger of the NMOS and for dispersing ESD current evenly during an ESD event, and the 70A-gate-oxide has superior reliability to withstand ESD stress.

Since the NMOS in FIG. 2 has control gates with thick gate oxides, it can be operated in the higher operating voltage applications for which the thick gate oxide is designed. Although the islands in the FIGS. 2 and 3 have thin gate oxides originally designed for lower operating voltage applications, they are immune to high voltage gate stress because the conductive segments of the islands are floated to couple voltage from the drain diffusion region 14b thereunder and reduce the voltage stress across the thin gate oxides. Therefore, the islands of the NMOS in FIGS. 2 or 3 have no gate oxide reliability problem even when operated in higher operating voltage applications.

Second Embodiment

Figure 4:
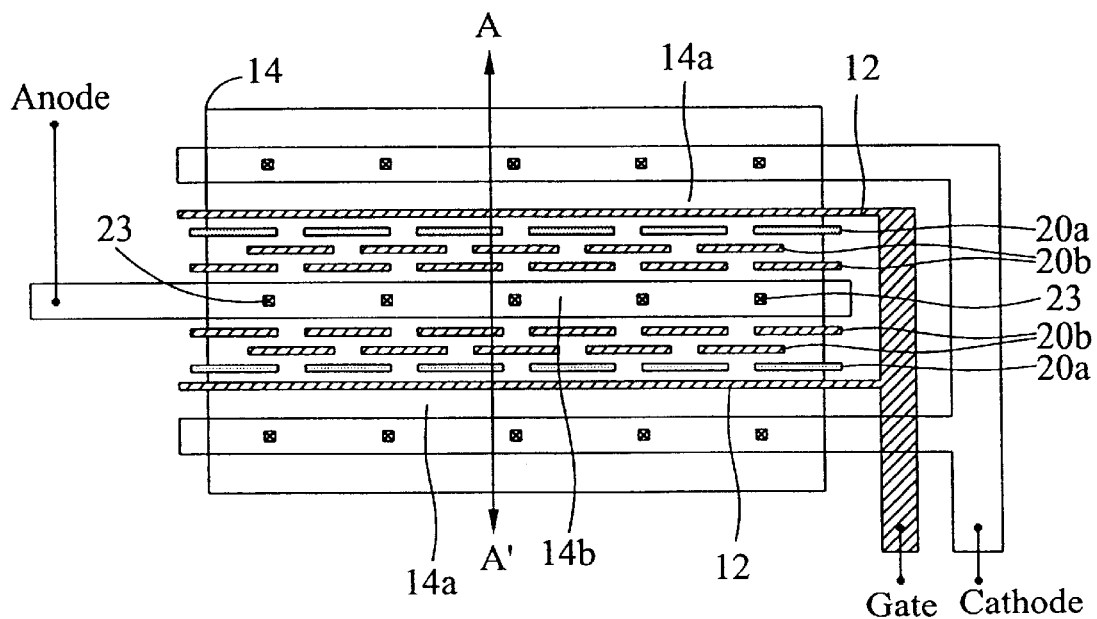
FIG. 4 shows a layout view of an NMOS structure with islands of different gate oxide thickness according to the present invention.
Figure 5:
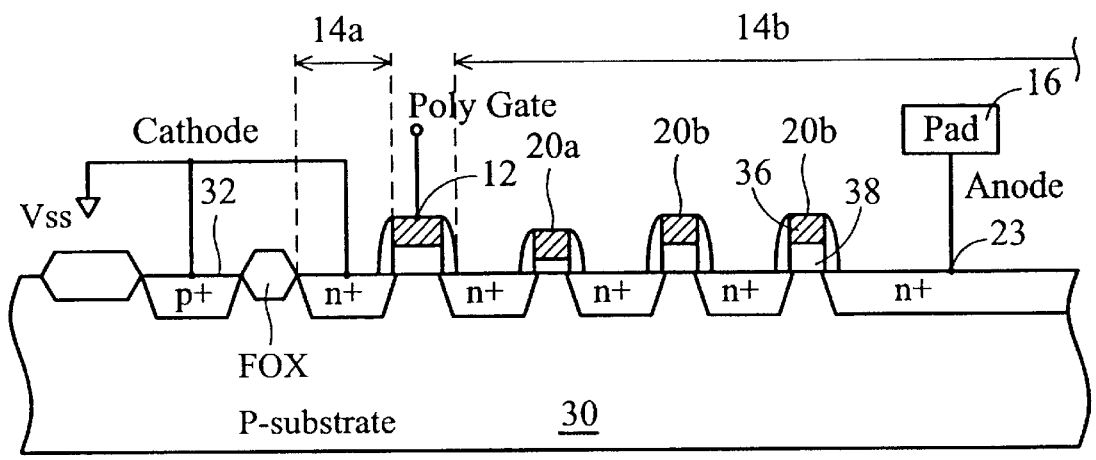
FIG. 5 is a cross-section of the NMOS structure in FIG. 4 along a portion of line A–A'.

FIG. 4 shows a layout view of an NMOS structure with islands of different gate oxide thickness according to the present invention. FIG. 5 is a cross-section of the NMOS structure in FIG. 4 along a portion of line A–A'.

Not all the islands in the ESD protection device need thin gate oxides. Islands with thin gate oxides have two purposes: one is quicker triggering of the NMOS to discharge ESD current, and the other is dispersing the current flow in the drain diffusion region 14b. The former purpose can be achieved even though there is only one island with a thin gate oxide overlaying the drain diffusion region. The latter purpose can also be achieved even when all the islands have thick gate oxides. Thus, the islands in the drain diffusion region 14b can have different gate oxides. FIGS. 4 and 5 depict this concept, where the islands 20a in the rows nearest the control gates have thin gate oxides for quicker triggering and the other islands 20b have thick gate oxides only for dispersing the current.

Third Embodiment

Figure 6:
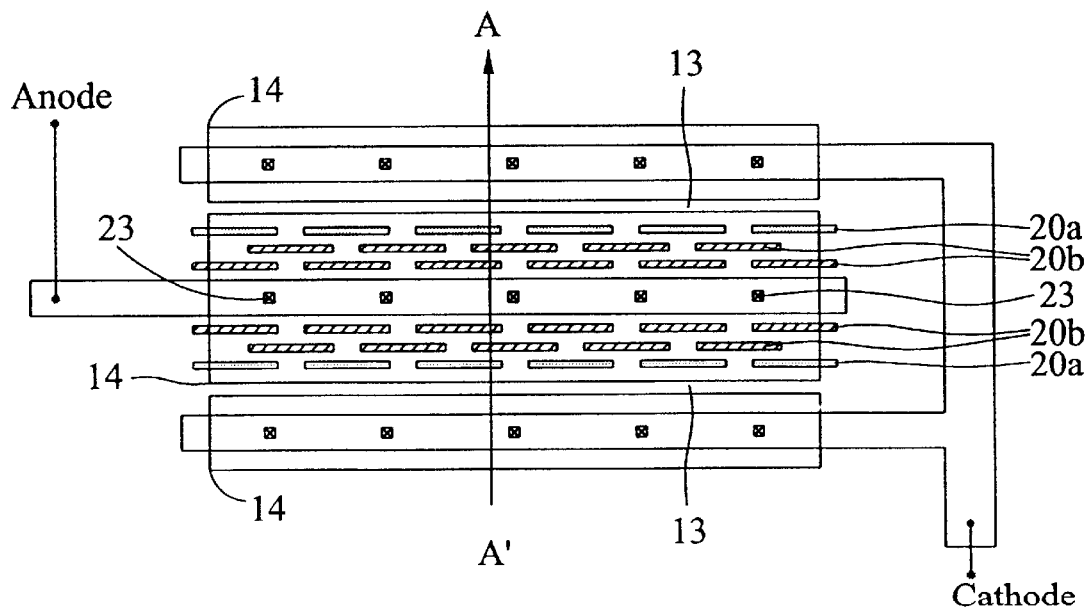
FIG. 6 shows a layout view of an NMOS structure with field gate oxides according to the present invention.
Figure 7:
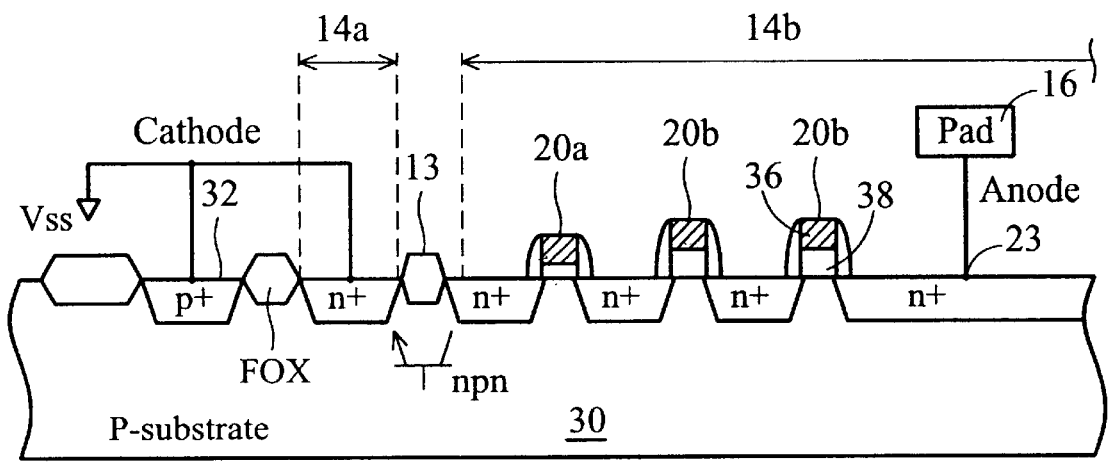
FIG. 7 is a cross-section of the NMOS structure in FIG. 6 along a portion of line A–A'.

FIG. 6 shows a layout view of a field device ESD protection structure with strips of field gate oxides over channels between adjacent anode-coupled and cathode-coupled diffusion regions according to the present invention. FIG. 7 is a cross-section of the structure in FIG. 6 along a portion of line A–A'.

The invention can be applied not only to an NMOS with control gates, but also to a field-device ESD protection structure with stripes of field oxide 13 over channels, as shown in FIGS. 6 and 7. Note that the channel in FIG. 7 is the base region for a lateral npn bipolar device structure formed by the cathode-coupled diffusion region, the channel region, and the anode-coupled diffusion region. Some of the islands in FIGS. 6 and 7 have thin gate oxides, and others have thick gate oxides.

Fourth Embodiment

Figure 8:
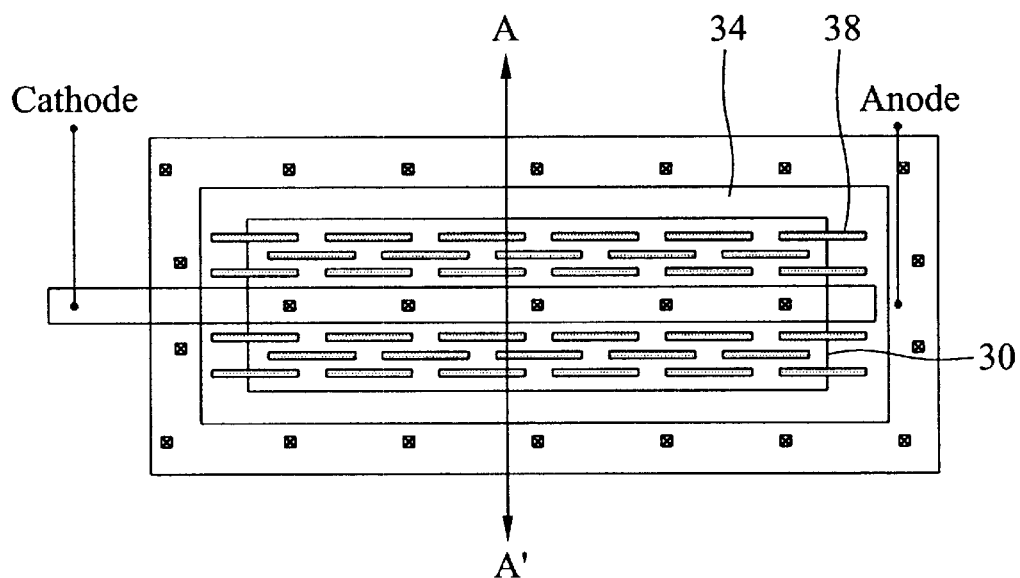
FIG. 8 shows a layout view of a diode structure according to the invention.
Figure 9:
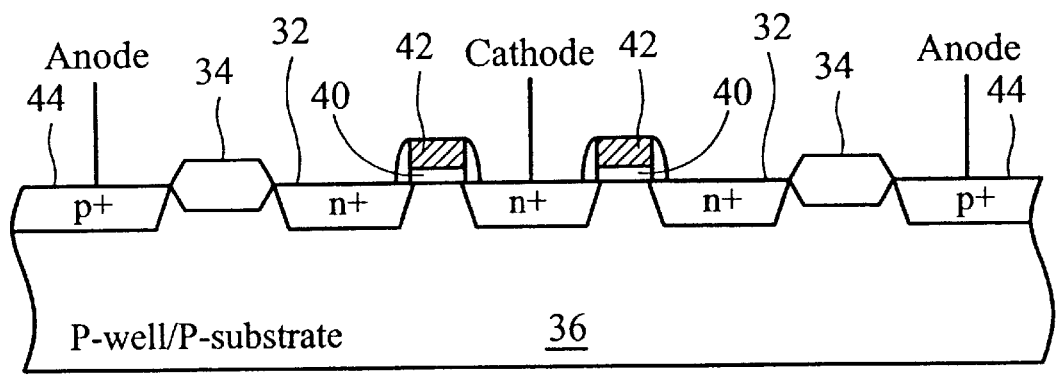
FIG. 9 is a cross-section of the diode structure in FIG. 9 along line A–A'.

FIG. 8 shows a layout view of a diode structure according to the invention. FIG. 9 is a cross-section of the diode structure in FIG. 9 along line A–A'.

The present invention can also be applied to a diode structure to form a diode with a lower breakdown voltage, equivalent to the ESD trigger voltage during an ESD event. The cathode of the diode in FIGS. 8 and 9 is the n+ diffusion layer 32 having a profile defined by the islands 38 and the active region 30 surrounded by the field oxides 34. These islands 38, having thin gate oxides 40 under conductive poly segments 42, at least partially overlap the active region 30. Some of the islands are located within the active region 30. The anode of the diode is the p-well/p-substrate 36 that proximate to the n+ diffusion layer 32 to form a PN junction and is connected to contacts via p+ diffusion layer 44.

The anode and the cathode of the diode according to the present invention can be respectively coupled to two pads, such as power pads or input/output pads. During normal operation, the PN junction must be reverse-biased so the voltage at the cathode is higher than that at the anode. Therefore, for example, the pad sets (Padx, Pady), where Padx and Pady are the pads respectively for the cathode and the anode, are (VDDH, VSSH), (I/O, VSSH), (VDDH, I/O), (VDDH, VDDL).

The islands 38 in FIGS. 8 and 9 contribute a lower breakdown voltage. During an ESD event, the ESD stress across the cathode and the anode makes the PN junction under the islands 38 break down earlier and conduct ESD current, thereby protecting the other devices in the same IC chip.

Although all the islands in FIGS. 8 and 9 have thin gate oxides, they are not required to. The requirement for applying the present invention is to place at least one island in the active region to form a PN junction, thereby reducing the breakdown voltage of the PN junction. Some of the islands can be replaced with islands with thick gate oxides or islands with field oxides, and a conductive element over the thin, thick, or field oxide is optional. The diode with an island structure can still have a lower ESD trigger voltage compared to the diode without an island structure.

Fifth Embodiment

Figure 10:
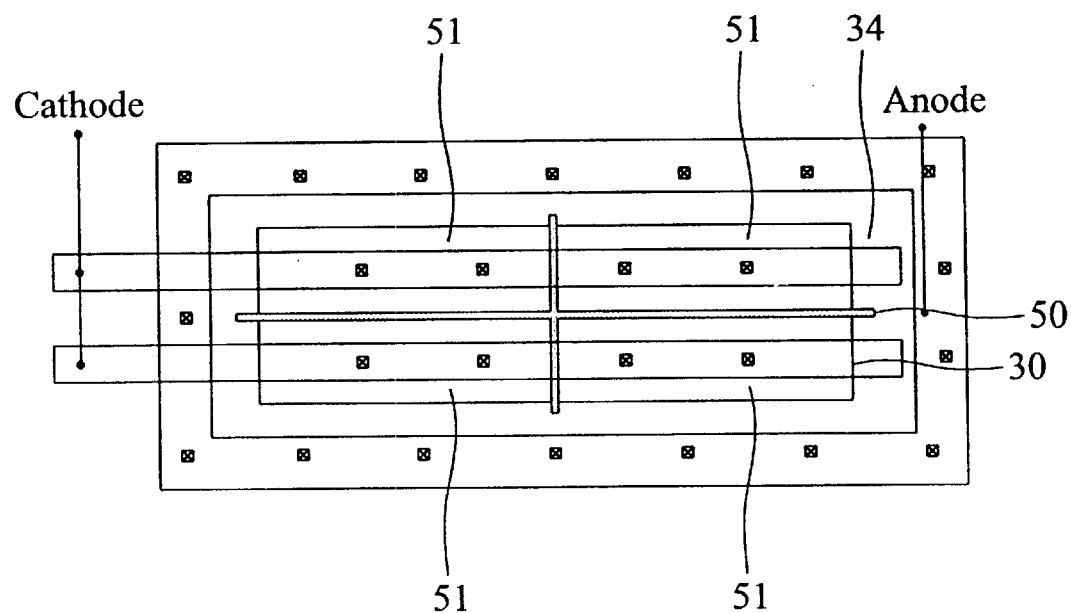
FIG. 10 shows a diode structure with four sub-regions defined by a cross-like island and the active region.

The islands for the diode can split the active region into several sub-regions, as shown in FIG. 10, which shows a diode structure with four sub-regions 51 defined by a cross-like island 50 and the active region 30. In FIG. 10, each sub-region 51 associates with the p-well/p-substrate (not shown) to form a sub-diode. These four sub-diodes are shunted together via contacts and metal strips to serve as a diode. The cross-like island 50 in FIG. 10 has a thin gate oxide under a poly segment for the purpose of reducing ESD triggering voltage.

The diode without islands is typically 10 volts or higher. With the island structure, however, the trigger voltage can be reduced to below 10 volt as disclosed earlier.

Sixth Embodiment

Figure 11:
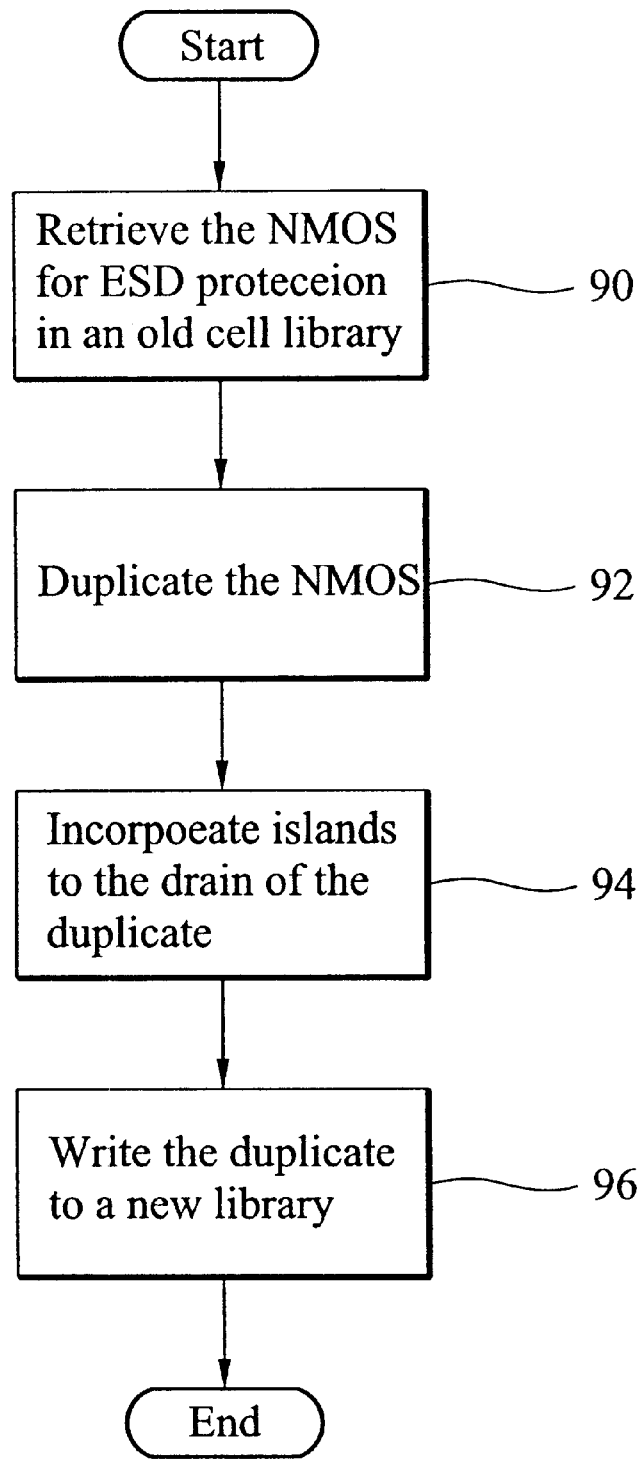
FIG. 11 illustrates a flowchart for modifying the NMOS in an old cell library.

FIG. 11 illustrates a flowchart for modifying the NMOS in an old cell library. To apply the present invention to an old cell library built up for a dual gate process but has no island for improving ESD protection level, the NMOS for ESD protection in the old cell library is first retrieved or provided (step 90). Such an NMOS is well known to have a drain, a source and a gate. A duplicate of the NMOS is made (step 92). Islands having thin gate oxides are incorporated at least into the drain of the duplicate (step 94). Finally, the duplicate with islands can be written back to the old cell library to overwrite the NMOS, or can be written to a new cell library (step 96).

As mentioned before, the structure of an island with a thin gate oxide has a much lower trigger voltage, thereby the incorporation of the NMOS and the island decreases the ESD trigger voltage of the NMOS. In a 0.25 um CMOS (complementary metal on semiconductor) technology, the NMOS having a control gate with a thick gate oxide in an old cell library has a trigger voltage of 9 volts, but has a trigger voltage of 7.5 volts if it incorporates islands of thin gate oxides in its drain. Such a new structure of NMOS has been shown in FIGS. 1–7. The trigger voltage difference induced by incorporating the islands depends upon the fabrication process and maybe as small as 0.5, 1 or 1.5 volt.

The present invention is not applied only to modify the structure of NMOS in the old cell library, but also the structure of the diode in the old cell library. The island can be put within or proximate to the anode or the cathode of the diode to reduce the breakdown voltage of the diode, thereby improving the ESD protection level of the diode. Such a new diode structure has been shown in FIG. 8 and others.

This procedure for cell library modification or creation can be automatically executed by a computer/workstation with a proper program. The modified devices can include any kind of device for ESD protection, and are not limited to NMOS or diodes.

Seventh Embodiment

FIGS. 12A to 12G depict the cross-sections of the ESD protection according to the present invention in different fabrication processes.

Figure 12A:
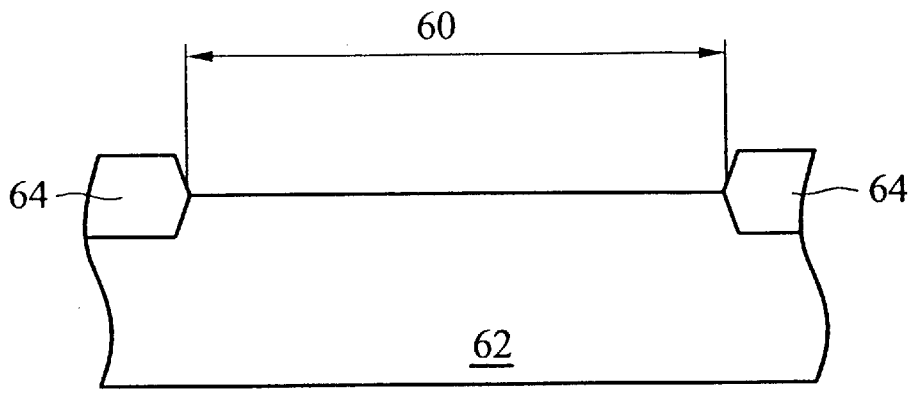
FIGS. 12A to 12G are cross-sections of the ESD protection according to the present invention at different fabrication processes.

The semiconductor wafer in FIG. 12A has a p-substrate 62. The surface of the p-substrate 62 has an active region 60 surrounded by a field oxide (isolation) region 64. The field oxide region 64 is typically formed by LOCOS or STI.

Figure 12B:
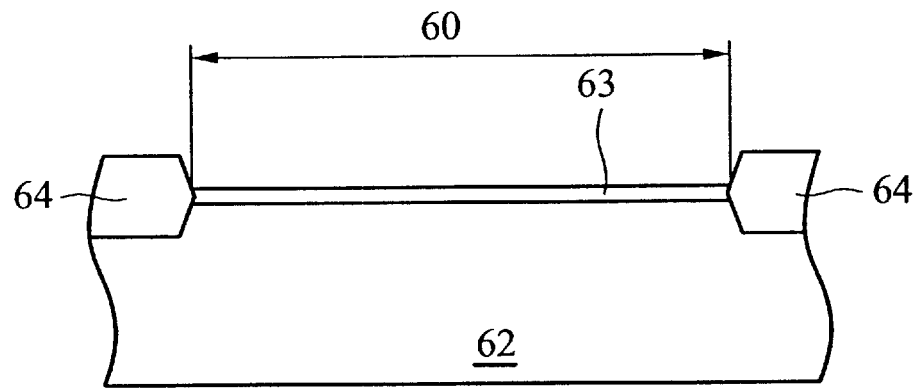

A gate oxide 63 is then formed on the active region 60, as shown in FIG. 12B, by oxidation or CVD (chemical vapor deposition).

Figure 12C:
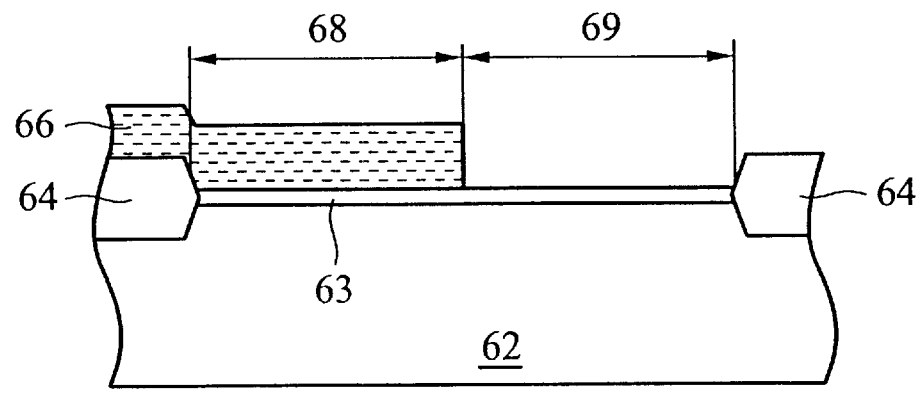

FIG. 12C depicts a developed photoresist film 66 is formed on the semiconductor wafer, where a portion, defined as a second region 68, of the active region 60 to form a thick gate oxide is covered by the photoresist film 66.

Figure 12D:
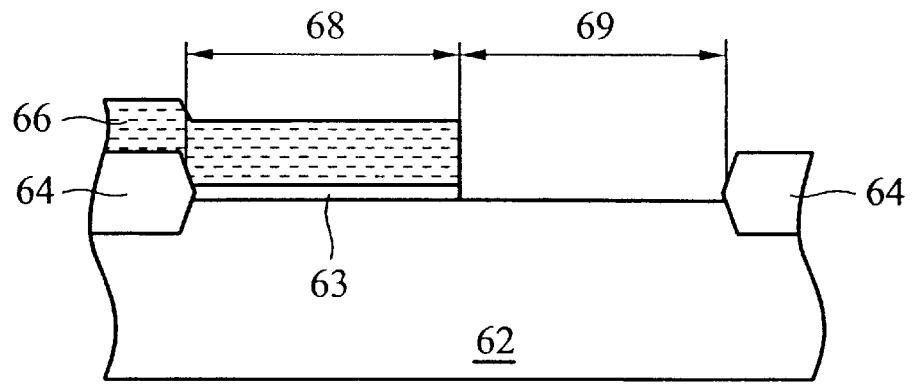

The gate oxide formed in the active region 60 but uncovered by the photoresist film is removed, as shown in FIG. 12D, by conventional methods, such as wet etch or dry etch. This portion of the active region 60 has no gate oxide on it and is defined as a first region 69.

Figure 12E:
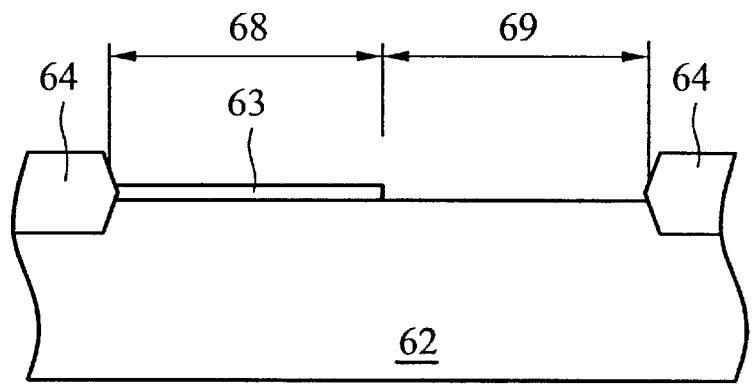

FIG. 12E depicts the photoresist film 66 in FIG. 12D is removed.

Figure 12F:
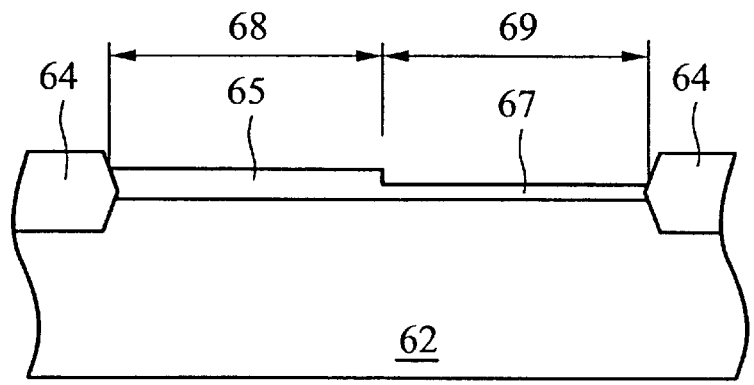

The gate oxide 63 on the second region is thickened to form a thick gate oxide 65 while a thin gate oxide 67 is formed on the first region, as shown in FIG. 12F. Typically, this step is performed by oxidation, which oxidizes both the surfaces of the first region and the second region.

Figure 12G:
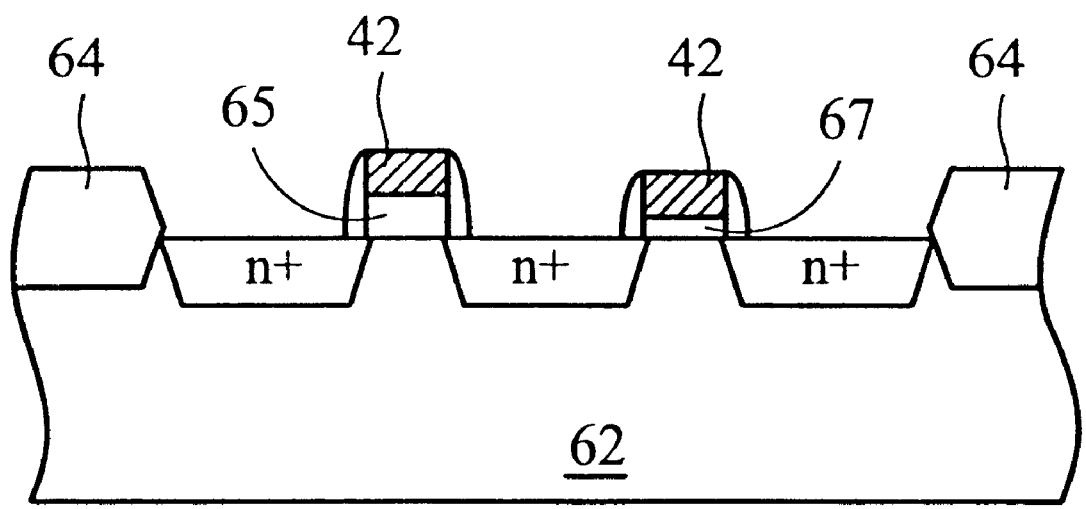

Please refer to FIG. 12G. A poly-silicon (poly in short) film is then formed on the semiconductor wafer. A lithography process and an etching process are then performed to pattern the poly film, such that two gate structures are primarily formed in the same active region 60. By conventional fabrication processes, these two gate structures can have spacers formed against their sidewalls and n+ diffusion region(s) as well as n− diffusion region(s) around them, as shown in FIG. 12G. Furthermore, salicide can be optional to form silicide film(s) on the surface of the n+diffusion region(s). These two gate structures differ at least by the thickness of the gate oxide. The one in the second region has a thick gate oxide, but the other in the first region has a thin gate oxide. These two gate structures can act as different devices, depending upon their application. For example, if that in the second region is laid across the active region and is biased under a certain voltage during normal circuit operation, it serves as a gate of an NMOS. If that in the first region has a floating poly segment, it is an island overlapping the active region. Alternatively, said island can be non-floating by comprising a conductive element overlying an oxide (or dielectric) layer ad coupling to an electrical node (such as VSS). This ESD protection device with the combination of an NMOS and islands has the benefit of a lower trigger voltage and has been shown in FIG. 2 and others.

Eighth Embodiment

FIGS. 13A to 13F depict the cross-sections of the ESD protection according to an alternative fabrication process of the present invention in different fabrication processing steps.

Figure 13A:
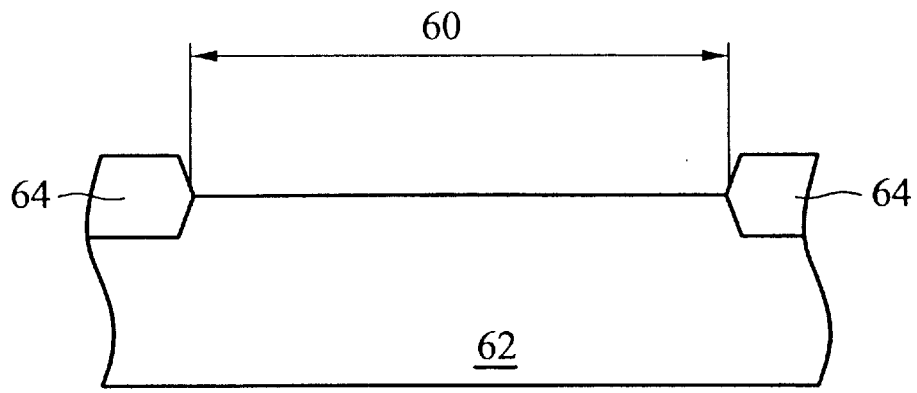
FIGS. 13A to 13F depict the cross-sections of the ESD protection according to the present invention at different fabrication processes.
Figure 13B:
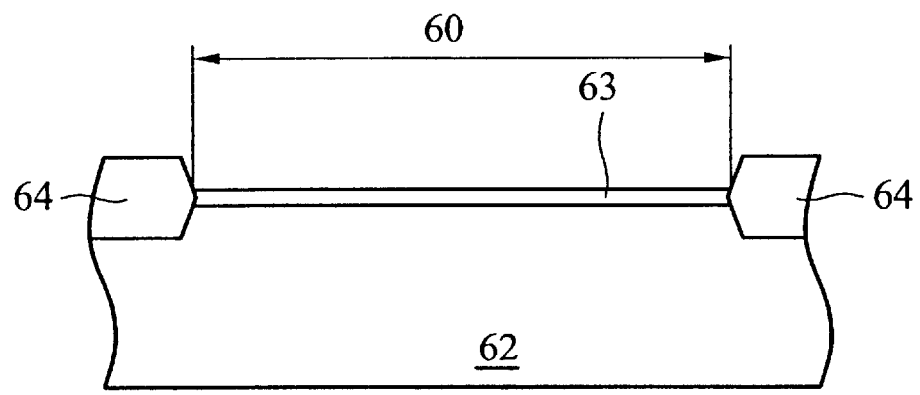

FIGS. 13A and 13B are the same as FIGS. 12A and 12B, explained before.

Figure 13C:
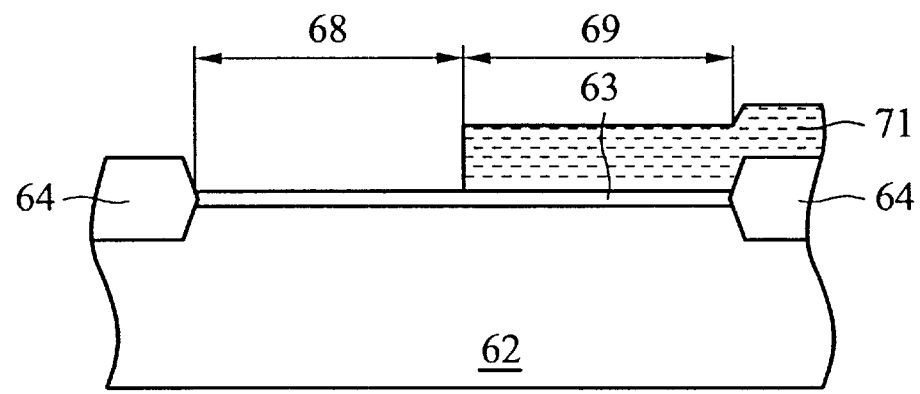
Figure 13D:
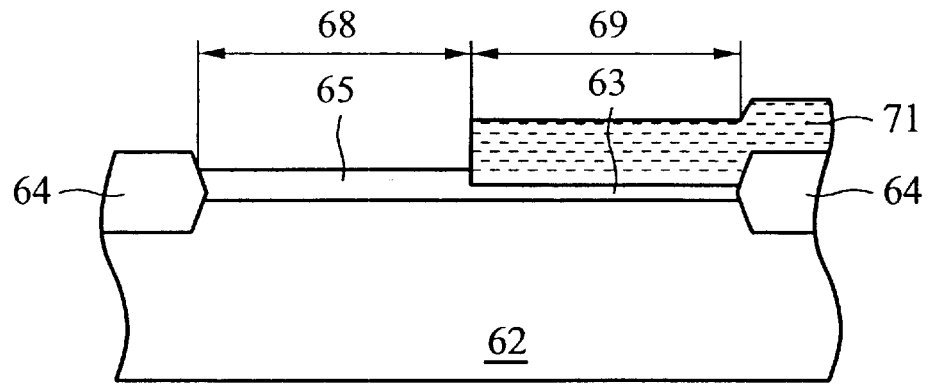

FIG. 13C depicts a developed photoresist film formed on the semiconductor wafer, where a portion, defined as a first region 69, of the active region 60 to form a thin gate oxide is covered by a patterned SiN (nitride) film 71. Another portion, defined as a second region 68 to form a thick gate oxide, has no SiN film 71 on it.

Figure 13E:
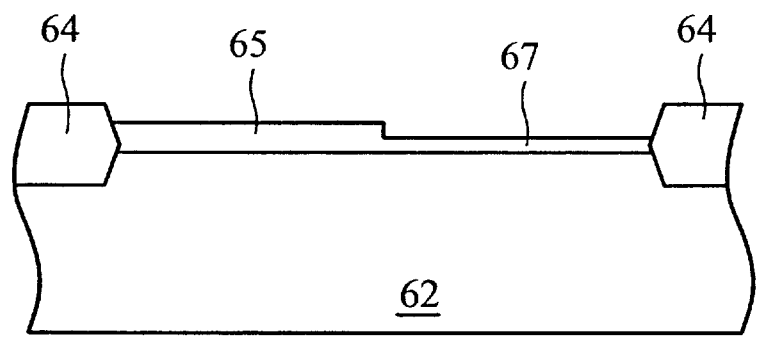

As shown in FIG. 13E, the gate oxide on the second region is thickened to form a thick gate oxide while a thin gate oxide is prevented from thickening by the SiN film. Typically, this step is performed by oxidation process, which further oxidizes the surfaces of the second region.

Figure 13F:
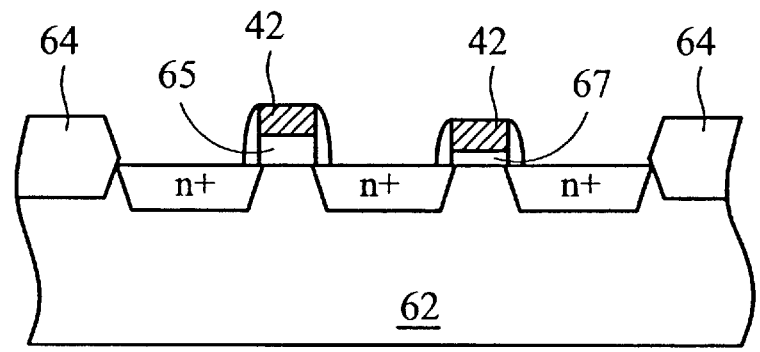

FIG. 13F is the same as FIG. 12G, which has been explained before.

Finally, while the invention has been described by way of examples and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A MOS (metal on semiconductor transistor) structure for ESD protection, applied for a dual gate process which fabricates a first gate oxide of a first thickness and a second gate oxide of a second thickness, the first thickness being smaller than the second thickness, comprising:

at least one first island, having a first conductive segment and a first gate oxide segment of the first thickness, the first conductive segment being stacked on the first gate oxide segment;

a drain region within which the first island is disposed; and a gate with a gate dielectric thicker than the first thickness.

2. The MOS structure as claimed in claim 1, wherein the gate dielectric is the second gate oxide.

3. The MOS structure as claimed in claim 2, wherein the gate has a second conductive segment over the gate dielectric.

4. The MOS structure as claimed in claim 1, wherein the gate dielectric is a field oxide.

5. The MOS structure as claimed in claim 1, wherein the first island partially overlaps a field oxide region adjacent to the drain region.

6. The MOS structure as claimed in claim 1, wherein the MOS structure has a drain electrode coupled to a pad and a source electrode coupled to a power rail.

7. The MOS structure as claimed in claim 1, wherein the MOS structure has a drain electrode and a source electrode respectively coupled to two power rails.

8. The MOS structure as claimed in claim 1, wherein the MOS structure further includes a second island comprising a second gate oxide segment of the second thickness.

9. A method for early triggering of an ESD device, applied for a dual gate process which fabricates a first gate oxide of a first thickness and a second gate oxide of a second thickness, the first thickness being different from the second thickness, comprising:

providing the ESD device having a first ESD trigger voltage; and incorporating an island having the first gate oxide within or proximate to the ESD device, wherein the island having a second ESD trigger voltage lower than the first ESD trigger voltage thereby early activating the ESD device during an ESD event.

10. The method as claimed in claim 9, wherein the first thickness is thinner than the second thickness.

11. The method as claimed in claim 9, wherein the ESD device is an MOS having a gate, a drain region and a source region, and the island is incorporated within or proximate to the drain region.

12. The method as claimed in claim 9, wherein the ESD device is a diode having an anode region and a cathode region, and the island is incorporated within or proximate to either the anode region or the cathode region.

13. The method as claimed in claim 9, wherein the island has a trigger voltage 0.5 volt lower than the ESD device.

14. The method as claimed in claim 9, wherein the island has a trigger voltage 1 volt lower than the ESD device.

15. The method as claimed in claim 9, wherein the island has a trigger voltage 1.5 volt lower than the ESD device.

16. A diode structure with reduced ESD trigger voltage, comprising:

a first region to form a first layer of a first conductivity type;

at least one island on the first layer, having a conductive segment and a gate oxide segment, the first conductive segment being stacked on the gate oxide segment; and a second region within the first region to form a second layer of a second conductivity type and a PN junction between the first layer and the second layer, the second layer having a profile determined by the island and the second region;

wherein the island is within the second region for reducing ESD trigger voltage of the PN junction.

17. The diode as claimed in claim 16, wherein the diode is fabricated by a dual gate process which further fabricates a first gate oxide of a first thickness and a second gate oxide of a second thickness, the first thickness being thinner than the second thickness, and the gate oxide segment of the island has a thickness equal to the first thickness.

18. The diode as claimed in claim 17, wherein the diode further has another island with a gate oxide segment of the second thickness.

19. The diode as claimed in claim 16, wherein the island is located to divide the second region into several sub-regions.

20. The diode as claimed in claim 16, wherein the first layer and the second layer are respectively coupled to two pads of an integrated circuit.

21. An exceeding-voltage rating structure for enhancing ESD protection, applied to a dual gate process which fabricates a first gate structure suitable for operating at a relatively low voltage and a second gate structure suitable for operating at a relatively high voltage, comprising:

a first region to form a first layer of a first conductivity type;

at least one island with the first gate structure on the first layer; and a second region within the first region to form a second layer of a second conductivity type and a PN junction between the first layer and the second layer, the second layer having a profile determined by the island and the second region;

wherein the island is within the second region for reducing ESD trigger voltage of the PN junction, and the exceeding-voltage rating structure serves to be operated in an specification having the relatively-high voltage.

22. The exceeding-voltage rating structure as claimed in claim 21, wherein the exceeding-voltage rating structure is an MOS with a gate of the second gate structure, and the second layer is the drain of the MOS.

23. The exceeding-voltage rating structure as claimed in claim 21, wherein the exceeding-voltage rating structure is an MOS with a gate of field oxide, and the second layer serves to be the drain of the MOS.

24. The exceeding-voltage rating structure as claimed in claim 21, wherein the exceeding-voltage rating structure serves to be a diode.

25. The exceeding-voltage rating structure as claimed in claim 18, wherein the exceeding-voltage rating structure further has another island with the second gate structure.

26. The exceeding-voltage rating structure as claimed in claim 21, wherein the relatively high voltage is 3.3 volts and the relatively low voltage is 2.5 volts.

27. An integrated circuit, fabricated by a process flow with a first dielectric layer of a first thickness, said first dielectric layer being designed for providing insulation under a gate electrode of an MOS rated to be operated at a first operating voltage, comprising:

an active region substantially surrounded by an isolation region;

a first heavily doped region disposed within said active region; and a first island disposed within said active region and having a first conductive element stacked on a first gate oxide of the first thickness, the first island being proximate to the first heavily doped region coupled to a power bus, the power bus being operated under a second operating voltage when said integrated circuit being powered on;

wherein the second operating voltage is higher than the first operating voltage.

28. The integrated circuit as claimed in claim 27, wherein the first island is at least partially enclosed by the first heavily doped region.

29. The integrated circuit as claimed in claim 27, wherein the first conductive element is a polysilicon element.

30. The integrated circuit as claimed in claim 27, further comprising:

a second heavily doped regions within the active region; and a channel region disposed between the first and the second heavily doped regions.

31. The integrated circuit as claimed in claim 30, further comprising:

a gate structure over the channel region.

32. The integrated circuit as claimed in claim 31, further comprising:

a stripe of isolation element extending from said isolation region over the channel region.

33. The integrated circuit as claimed in claim 27, wherein the first island partially overlaps the isolation region.

34. The integrated circuit as claimed in claim 27, wherein the first island is fully enclosed by the first heavily doped region.

35. The integrated circuit as claimed in claim 27, further comprising a second island at least partially enclosed by the first heavily doped region.

36. The integrated circuit as claimed in claim 35, wherein the second island is fully enclosed by said first heavily doped region.

\* \* \* \* \*